United States Patent [19]
Greene et al.

[11] Patent Number: 5,581,257
[45] Date of Patent: Dec. 3, 1996

[54] RADIO FREQUENCY AUTOMATIC IDENTIFICATION SYSTEM

[75] Inventors: Morton Greene, Arlington; G. William Hurley, Catlett, both of Va.

[73] Assignee: Gordian Holding Corporation, Dover, Del.

[21] Appl. No.: 298,070

[22] Filed: Aug. 30, 1994

Related U.S. Application Data

[60] Continuation-in-part of Ser. No. 203,538, Feb. 28, 1994, which is a division of Ser. No. 978,825, Nov. 19, 1992, Pat. No. 5,291,205, which is a division of Ser. No. 765,925, Sep. 24, 1991, Pat. No. 5,204,681.

[51] Int. Cl.$^6$ .................................................. G01S 13/80
[52] U.S. Cl. ............................. 342/51; 342/27; 235/375
[58] Field of Search ................................ 342/27, 51, 44; 235/375

[56] References Cited

U.S. PATENT DOCUMENTS

| | | | |
|---|---|---|---|
| 3,750,167 | 7/1973 | Gehman | 342/27 |
| 3,893,109 | 7/1975 | Chiron | 342/27 |
| 4,837,574 | 6/1989 | Hill | 342/27 |
| 5,414,427 | 5/1995 | Gunnarsson | 342/51 |

*Primary Examiner*—Harold Pitts
*Attorney, Agent, or Firm*—Reed Smith Shaw & McClay

[57] ABSTRACT

A radio frequency automatic identification system detects targets which include a plurality of radio frequency resonators. Information is attributed to the target in accordance with the radio frequency response characteristics of the target, such as the resonant frequencies of resonators present, and/or the spatial locations within the target of the resonators. Preferred resonators include thin dipoles, which may be metallizations on a plastic film substrate. Information may be attributed to a target by fabricating the target with resonators disposed at locations to encode information in accordance with a predetermined encoding system; alternatively, resonators may be randomly disposed, and a translation code applied to convert the radio frequency information to particular information in a particular format. Readers for use in the system read the radio frequency response characteristics of a target in the near field of a radiating aperture which is illuminated by a radio frequency source. Items which may be encoded with radio frequency readable information include documents, credit cards, and computer diskettes.

71 Claims, 10 Drawing Sheets

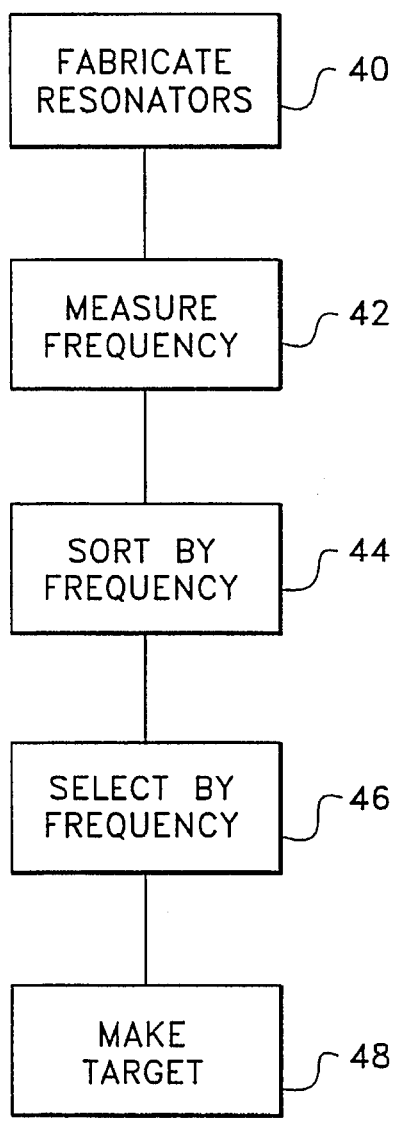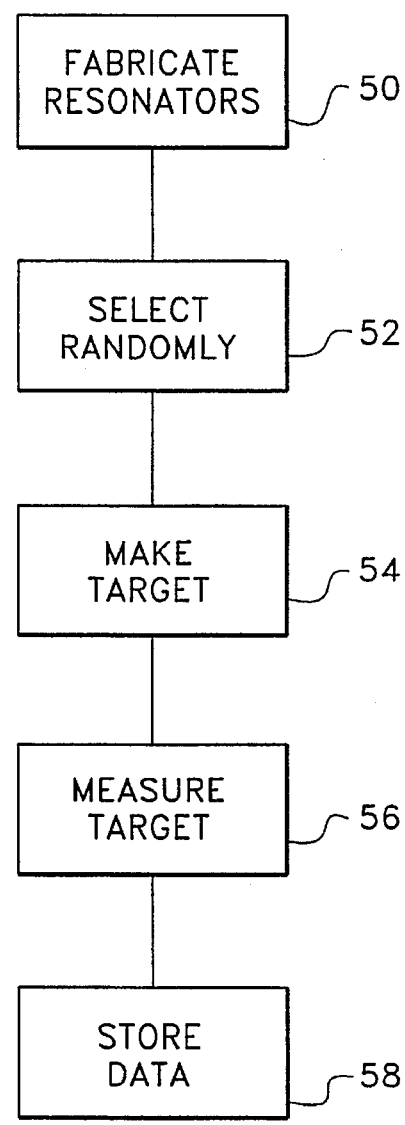
*FIG. 6*  *FIG. 7*
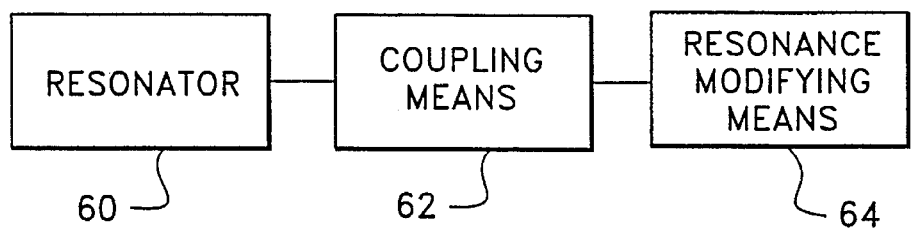
*FIG. 9*

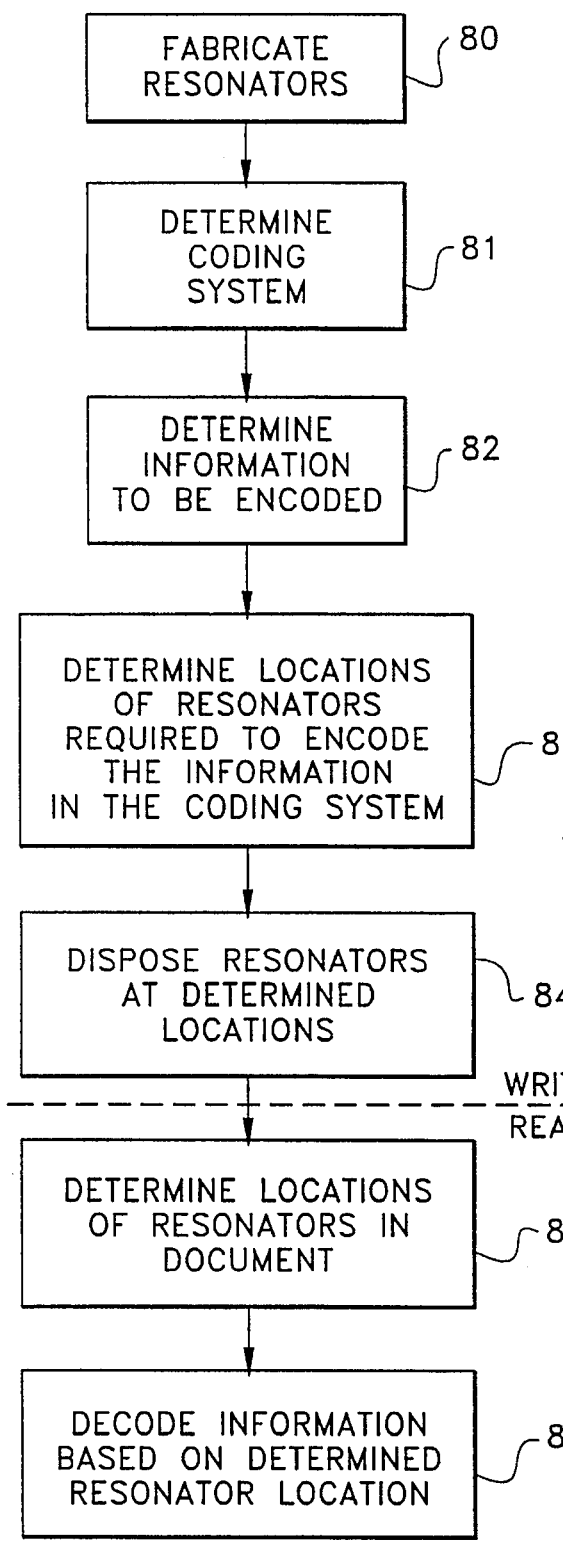
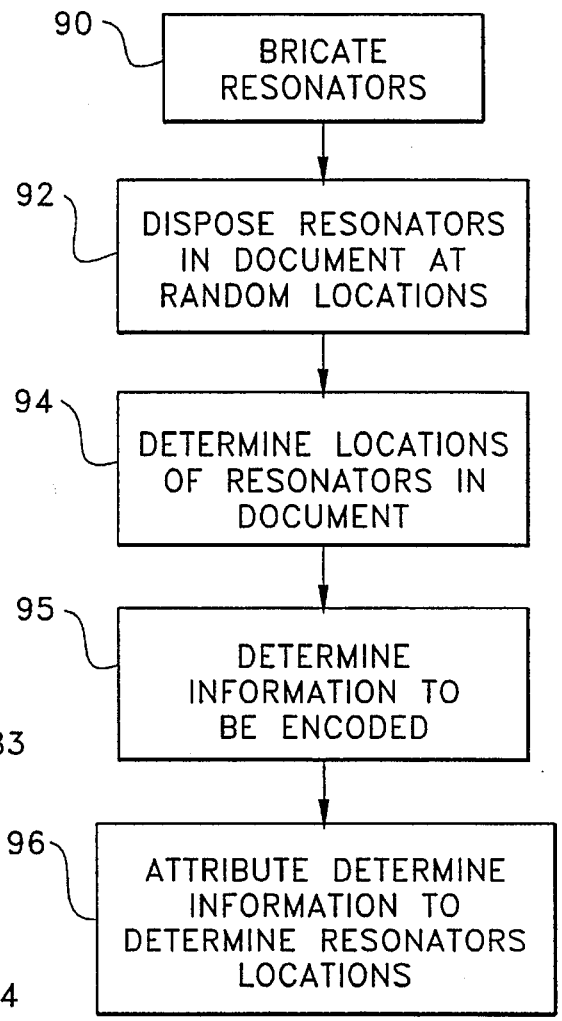
FIG. 12A
FIG. 11

RADIO FREQUENCY AUTOMATIC IDENTIFICATION SYSTEM

This application is a continuation-in-part of U.S. application Ser. No. 08/203,538, filed Feb. 28, 1994; which is a division of U.S. application Ser. No. 07/978,825, filed Nov. 19, 1992, issued Mar. 1, 1994 as U.S. Pat. No. 5,291,205; which is a division of U.S. application Ser. No. 07/765,925, filed Sep. 24, 1991, issued Apr. 20, 1993 as U.S. Pat. No. 5,204,681.

FIELD OF THE INVENTION

This invention relates to automatic identification of items using radio frequency signals. More particularly, this invention relates to production of radio frequency responsive materials for use in such a system; to radio frequency responsive targets using such materials; and to systems for automatic radio frequency identification of items by such targets.

BACKGROUND OF THE INVENTION

Automatic identification systems are widely used to input data into computer systems and to control operation of equipment. Radio frequency operated systems are often used in automatic identification applications where identification of an object is to be made without contact and where the application may not permit line-of-sight communication between the object and a sensor. Radio frequency automatic identification ("RF/AID") systems are based on "targets" which generally function as transponders. Upon receipt of a radio frequency interrogating signal, the target responds by producing a detectable radio frequency response signal. Such targets have taken the form of tags or labels which are affixed to an object to be identified. As used herein, a "target" is any radio frequency responsive means which may be attached to, printed upon, embedded in, or otherwise associated with an object to be identified. Although the term "radio frequency" is used herein because that is the region of the electromagnetic spectrum which is most frequently used for such automatic identification, it will be understood that the invention embraces any electromagnetic radiation.

Automatic identification systems are presently used or contemplated for use in a wide variety of applications for monitoring of people, animals, locations, and things. Such applications include material handling, such as automatic storage and retrieval; cargo handling, such as baggage sorting and tracking; asset management, such as of rental vehicles or for retail theft control; identification of persons, such as for facility access control or patient tracking; and identification of animals, such as for automatic feeding.

One major attribute of presently available RF/AID systems which limits their use is that the target cost is substantial. Situations in which this high cost can be justified include those where targets are removed from an item after purchase and reused on other items, those where the item to be identified is costly or important, and those where an item is likely to be misappropriated absent some effective control system. Another attribute which restricts use of present RF/AID systems is the target size. Targets are typically several inches long, which inhibits their use where small items are to be identified or where it is desired that the target be unobtrusive.

Both of these attributes result in large part from the structure typically employed for RF/AID targets and the frequency at which they operate. Such targets typically contain an antenna for receiving an interrogating RF signal; radio frequency processing means for determining whether an interrogating signal has been received; and radio frequency transmitting means responsive to the processing means for transmitting a detectable RF response signal from the target. Present systems typically operate at fairly low frequencies.

One application for which existing RF/AID techniques have not been used, due to the cost, size, and limited information content of prior art targets, is identification of documents including currency and financial instruments such as credit cards. Counterfeiting of currency has become a major problem, on scales and using technology ranging from color photocopying to altering of genuine currency printing operations. Credit card fraud, involving magnetic programming of counterfeit cards or reprogramming of genuine ones, has become epidemic. Existing techniques for identifying such items are obviously deficient. Ordinary business documents would desirably be protectable from unauthorized copying or use and verifiable as original or genuine, but no effective means for doing so are available.

The present invention is directed to a new system for RF/AID which avoids the foregoing drawbacks of the prior art and is suitable for use in a wide variety of applications which were not possible using prior art systems.

SUMMARY OF THE INVENTION

The present invention comprises several aspects which are useful together to provide a new system for automatic identification.

In one aspect of the invention, a radio frequency target includes a plurality of resonant articles, resonating at a plurality of radio frequencies. The resonant frequencies of the articles are used to provide identification data. In a preferred embodiment of this first aspect of the invention, the resonant articles are passive solid state resonators. In a particularly preferred embodiment, the articles are materials in the quartz family, such as quartz crystals, which may be fabricated having various desired properties and shapes.

In another aspect of the invention, a method of making a target having resonant articles to provide identification data includes the step of measuring the resonant frequencies of the resonant articles. In a particularly preferred embodiment of this aspect of the invention, resonant articles for use in a particular target are selected according to their resonant frequency as previously measured.

In another aspect of the invention, items are identified by transmitting radio frequency interrogating signals into a target field and evaluating the response of the target field to determine whether the field contains resonant articles. In a preferred embodiment of this aspect of the invention, the frequency of the interrogating signal is varied so as to determine the response of the target field to different frequencies. In a particular preferred embodiment of this aspect of the invention, the presence or identity of a target in the target field is evaluated according to the frequencies at which the target field response indicates the presence within the field of resonant articles.

In another aspect of the invention, a radio frequency target includes a plurality of resonant articles, which are located at spatially differentiable positions in the target. The spatial locations of the resonant articles are used to provide identification data; the resonant frequencies of the articles may also, but need not, provide identification data. In accordance with this aspect of the invention, items are identified by transmitting radio frequency interrogating signals into a target field and evaluating the radio frequency response of the target field to determine whether it contains such articles and the location thereof. The spatial locations of any resonators in the target field having appropriate resonant frequencies, and perhaps the resonant frequencies of such resonators as well, are determined in order to evaluate the information contained within the target.

In another aspect of the invention, various methods of making targets with resonant articles at spatially differentiable locations are provided. In one such method, the articles are disposed at predetermined information-bearing locations during the manufacture of the target, to encode particular predetermined information. In a second such method, the articles are disposed at random locations during the manufacture of the target, and information is later attributed to the target by determining the locations at which resonant articles are positioned in it. In a preferred embodiment of this second method, an automatically readable translation code is subsequently generated based on the determined locations of resonant articles, whereby a standard identification system may produce information which is desired to be attributed to the target, in a standard format, by operating on the random resonant article-position information and the information of the translation code. The translation code may be encoded in the target itself or stored separately.

In another aspect of the invention, a system is provided for automatically acquiring information from a target containing information in the location in the target of resonant articles. In a preferred embodiment of this aspect of the invention, a transceiver for transmitting interrogating signals to and receiving response signals from a target field includes a resonant iris aperture which is adjacent to a location on a target to be interrogated. The presence, in the target location being interrogated, of a resonant article having a resonant frequency near that of the aperture, creates a large reflection of the interrogating signal which may easily be detected as an information-bearing response signal. In a particularly preferred embodiment of this aspect of the invention, the transceiver apparatus includes a plurality of such apertures which are separated from one another, so that the acquisition of information from separate target locations may take place simultaneously and the identification process may be performed quickly.

In another aspect of the invention, the resonant articles are conductive structures which are printed on, or embedded in, or otherwise applied to a dielectric substrate to form a target. The geometry of each structure determines the frequencies at which it provides a detectable radio frequency response; such frequencies, and/or the spatial locations of the conductive structures, provides the target with information. This aspect of the invention is useful for identifying documents, and in a particularly preferred embodiment, the conductive structures include structures having the shape of ordinary human-readable alphanumeric characters.

Other aspects of the invention will become apparent upon review of the following specification and the drawings.

BRIEF DESCRIPTION OF THE DRAWINGS

FIG. 6 is a flow diagram of a process for producing targets in accordance with the invention.

FIG. 7 is a flow diagram of another process for producing targets in accordance with the invention.

FIG. 9 is a block diagram illustrating a resonator whose resonant characteristics may be altered to alter information in a target.

FIG. 11 is a flow diagram of a process for reading and writing information which is encoded in a document by resonator spatial location.

FIG. 12, comprising FIGS. 12A, 12B and 12C, is a flow diagram of other processes for reading and writing information which is encoded in a document by resonator spatial location.

DETAILED DESCRIPTION

The system of the present invention provides automatic item identification in a manner which, like existing RF/AID systems, can be free from the constraints of line-of-sight detection imposed by barcode systems and short range detection imposed by magnetic encoding systems. Unlike existing RF/AID systems, the system of the present invention is operable with inexpensive targets which may be of small size and/or large information density. The system is operable at great distances as well as in confined areas. The information-containing components of the invention may be fashioned into targets which are easily applied to a wide variety of items to be identified. Such items may be reliably identified using versatile, low-cost interrogating systems.

Figure 1:
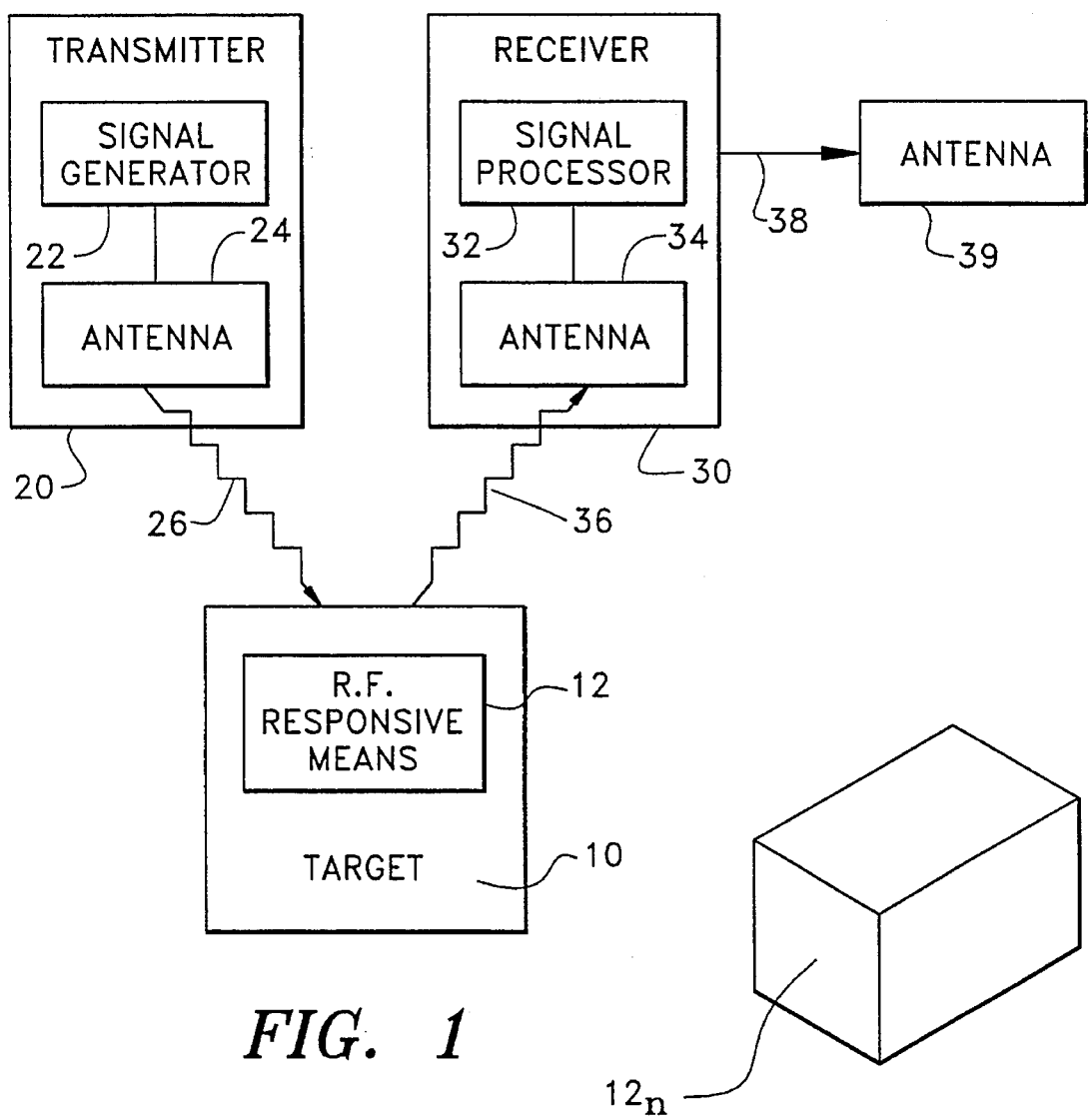
FIG. 1 is a block diagram generally illustrating the functional elements of an RF/AID system.

FIG. 1 generally illustrates the functional elements of an RF/AID system. The system includes a target 10 which includes and serves as a carrier for radio frequency responsive means 12. Such a target 10 may be affixed to or incorporated in an item to enable it to be detected and/or identified by a system, often referred to as a scanner or reader, which includes a radio frequency transmitter 20 and a radio frequency receiver 30. Transmitter 20 includes a signal generator 22 coupled to an antenna 24 for generating radio frequency interrogating signals 26 in a desired target field. Receiver 30 receives radio frequency response signals 36 at antenna 34 coupled to signal processor 32. Signal processor 32 produces an output 38 indicative of the presence of a target 10 within the target field in response to the response signals 36 received by antenna 34. Output 38 may be supplied to a computer or other identification information processing system 39. Transmitter 20 and receiver 30 may be physically associated in a single transceiver unit, and the functions of antennas 24 and 34 may be performed by a single antenna. A system as shown in FIG. 1 may be designed to detect radio frequency responses means in the near field of the antenna(e), in the far field of the antenna(e), or both.

Figure 2:
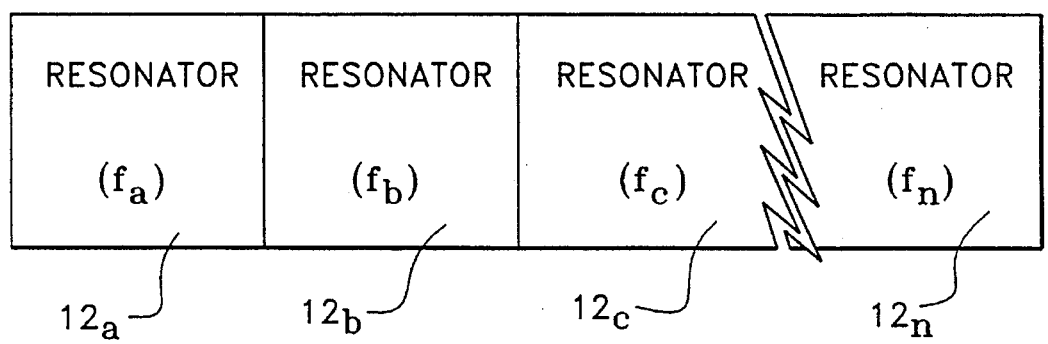
FIG. 2 is a block diagram illustrating in greater detail the radio frequency responsive means shown in FIG. 1.

FIG. 2 functionally illustrates in greater detail the preferred radio frequency responsive means 12 shown in FIG. 1. Responsive means 12 includes a plurality of devices which are resonant at radio frequency. FIG. 2 shows resonant means or resonators 12a, 12b, 12c . . . 12n which are resonant at frequencies $f_a$, $f_b$, $f_c$ . . . $f_n$. These frequencies represent a subset of possible resonant frequencies which may be provided by resonators in target 10. In some aspects of the invention, the resonators may have the same resonant frequency or resonant frequencies which are not intended to provide identifying information; in other aspects of the invention, the resonators may have different resonant frequencies, and the particular frequencies present provide the target with identification data.

Figure 3:
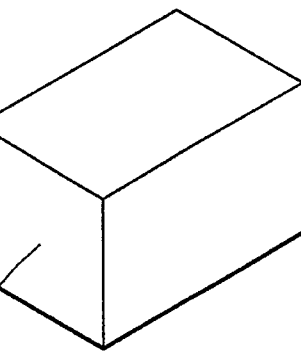
FIG. 3 illustrates a preferred radio frequency responsive means.

FIG. 3 illustrates a preferred embodiment of a resonator 12n. The resonator comprises a piece of solid material having dimensions, electromagnetic properties, and/or mechanical properties rendering it resonant at radio frequency. Although depicted as a rectangular prism, it will be understood that a large variety of shapes may be used in devices having suitable radio frequency response characteristics.

One preferred resonator 12n is a quartz crystal. Such crystals have electrical and mechanical properties which enable them to be used as accurate, rugged, reliable, and stable frequency determining elements. While a resonator suitable for use in the present invention may consist merely of a quartz crystal, it may be desirable to tailor its properties for particular applications by modifying it to alter its characteristics such as by improving its Q. For instance, it may be desirable to dope the quartz with another material, such as gallium. It may also be desirable to couple the crystal to auxiliary structures such as metallizations forming antennas to improve coupling of incident radio frequency energy to the crystal or to control the mode of operation of the crystal, for instance such as is done in a surface acoustic wave device. Although quartz crystals are preferred resonators, useful solid resonators may no doubt be made from other crystalline materials or from non-crystalline solids. For instance, other preferred resonators include thin dipoles, materials operating in electron paramagnetic resonance, and ferrite materials operating in the ferroelectric mode. Moreover, as will be discussed with respect to certain embodiments of the invention, other properties of such resonators besides their resonance may be detected to obtain identification information; for instance, the short circuiting effect of a thin dipole or similar resonant conductive structure may be detected by a suitable transceiver.

Such a resonator 12n may be resonant at several frequencies and may be structured so that several such frequencies are used to provide identification information in a target. At any rate, the resonator is configured so that it resonates at least at one resonant frequency which in certain embodiments is an information-carrying frequency in the system.

While a variety of frequency ranges may be used in systems according to the present invention, high frequencies are believed preferable for a variety of reasons including availability for use, size of resonator required, identification range, and ability to control the interrogating signal. Thus, for instance, frequencies in excess of about 1 GHz are preferred, particularly frequencies in excess of about 10 GHz. Frequencies may be used up to and even above 500 GHz, near visible light frequency.

Figure 4:
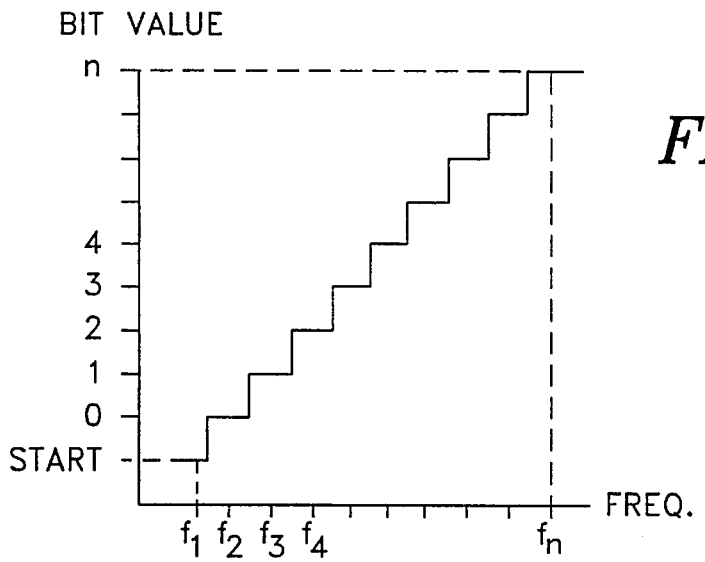
FIG. 4 is a graph illustrating a method whereby numerical data may be attributed to frequency.

FIG. 4 illustrates generally how identification information is provided in accordance with one aspect of the present invention. FIG. 4 is a graph of attributed numerical value versus frequency. The frequency domain is divided up into a plurality of bands or "windows", each representing a binary digit or bit value. Thus an n-bit number requires n distinguishable frequency bands. One or more "start" bits may be required in a target. Thus, for instance, an identification band of 60.0–60.1 GHz may be partitioned into 10 windows each of which is 10 MHz wide including any "stop" bands between adjacent windows which may be desired. These windows may be defined in the system to represent a start bit and a 9-bit data word. In the terms of FIG. 2, any resonators 12 present would be required to fall into one of the 10 frequency windows defined in the system of this example, and 10 resonators would be required to provide a target with a start bit and all 9 available data bits.

Referring to FIG. 3, it is noted that although one such solid resonator is necessary and sufficient to provide one bit of information by resonance, it may be desirable to use a number, perhaps even a very large number, of individual resonators such as crystals to form each identifying resonant means of FIG. 2. Increasing the number of individual resonators can provide a cheap and reliable way of increasing the target's responsiveness to a given intensity of interrogating signal at the target. Thus, a large number of crystals each having a frequency in a certain window will enable the presence of the corresponding data bit in the target to be detected at long range, with low power interrogation, and/or with a low gain receiver, any of which may be highly desirable in a given application.

An important part of the present invention lies in the ability to provide resonant devices for use in targets which are cheap, accurate, and stable. As noted above, preferred resonant devices include quartz crystals forming solid state passive resonators. Although quartz crystals are currently produced in large numbers for use in frequency determining applications, existing techniques for production would probably be too expensive for economical use in the RF/AID system of the present invention. Such crystals presently are carefully cut to precise dimensions to produce products meeting very tight frequency tolerance requirements.

To avoid the limitations of existing production techniques, so as to provide a method for inexpensively producing crystals in large numbers for use in the system of the present invention, a novel method for manufacturing is provided, comprising generally two parts. The first part is a method of inexpensively producing solid resonators such as quartz crystals in large numbers, with each resonator having resonant characteristics reasonably likely to fall within the system's identification band. The second part is determining the resonant characteristics of individual resonators by measuring their as-produced characteristics.

The preferred method of providing solid resonators is to fabricate resonators of a solid material in approximately desired size and to select resonators according to their measured resonant characteristics. Applicant believes that the following method would satisfy the requirements of the invention.

When quartz is heated sufficiently, it softens somewhat prior to liquefying. It is believed that such heated softened quartz may be easily cut and/or molded into dimensions and shapes suitable for use as radio frequency resonators. Thus, it is believed that a mass of quartz may be softened by heating, passed through a forming die in a process in the nature of extrusion, and cut into individual crystals, which are then cooled, such as by quenching. Quenching may be performed by immersion in a liquid such as water, oil, petroleum based liquids, or other hydrogen, oxygen, or carbon based liquid. Crystals so produced may then be collected for further processing. Other methods of providing a number of crystals or other resonators having approximately proper characteristics may no doubt be provided.

Figure 5:
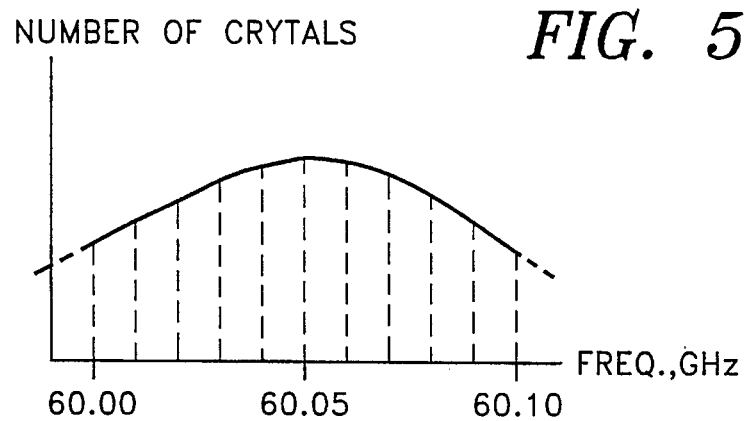
FIG. 5 is a graph showing a distribution of resonant frequencies in a process for producing resonators.

Desirably, the process used for manufacturing resonators of approximately correct resonant characteristics would produce a distribution of characteristics exactly corresponding to the need for resonators in each window. More likely, a manufacturing process will produce resonators with another distribution, such as a normal distribution of resonator frequencies. Such a distribution desirably substantially coincides with the range for a particular identification band or bands to be used for RF/AID. For instance, FIG. 5 shows an approximately normal distribution centered around 60.05 GHz, which might be produced in a process to make resonators in approximately equal numbers in each window of the 60.0–60.1 GHz band described with respect to FIG. 4.

Once a process is developed for producing resonators differing in characteristics, resonators so produced may be fabricated into information-carrying targets. FIGS. 6 and 7 show two methods for producing targets which are identifiable by frequency for use in RF/AID systems.

FIG. 6 is the presently preferred method for producing such targets. In step 40, a set of resonators is produced by a process or processes designed to yield resonators having differing resonant frequencies approximating a desired value. The frequency of each resonator is measured in step 42, and in step 44 the resonators are sorted by frequency in accordance with the measurement made in step 42. For instance, quartz crystal resonators may be fabricated as described above, conveyed to a measuring system which may be similar to the system in FIG. 1, and each crystal sorted by identifiably marking it or preferably by segregating it with other crystals of the same or similar frequency. Thus, with reference to FIGS. 4 and 5, upon completion of sorting step 44, one might have 10 containers, each of which contains crystals from only one frequency window representing only one bit of information. A set of crystals having frequencies which represent the bits of an identifying digital word are selected in step 46, and a target is made using the selected crystals in step 48. The method of FIG. 6 permits one to make a target containing predetermined identifying data.

In contrast, FIG. 7 shows a method for making targets which contain random or uncontrolled identifying data rather than predetermined identifying data. After fabrication of resonators having differing frequencies in step 50, a set of resonators is randomly selected in step 52 and incorporated into a target in step 54. A measurement is made in step 56 to determine the frequencies of the resonators which were incorporated into the target. Measured data is stored in step 58 so that the target can be identified as valid when it is interrogated in actual use.

Figure 8:
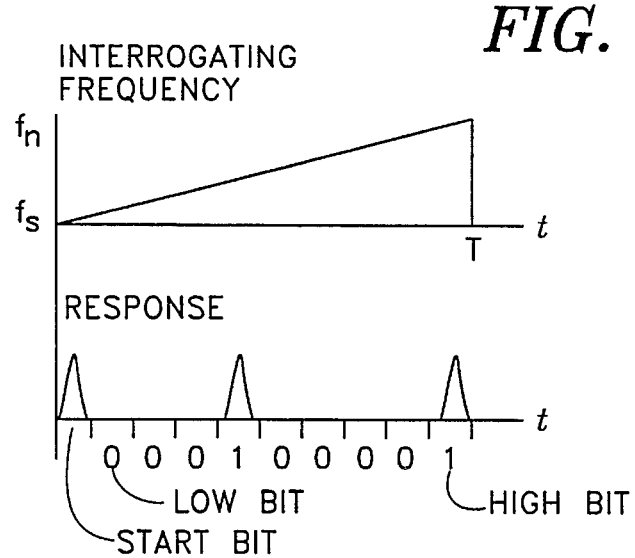
FIG. 8 is a graphical illustration of a preferred method of radio frequency signal generation and processing.

FIG. 8 illustrates a preferred method of generating and processing radio frequency signals in accordance with the present invention. In accordance with this method, the target field is interrogated for possible resonant articles by varying the transmitted frequency in a range which includes the applicable information-bearing band of the system.

FIG. 8 is a pair of graphs, the top showing interrogating signal frequency with respect to time and the bottom illustrating a possible RF response from the target field over the same time interval. As shown in the top graph, the frequency of interrogating signal is varied from a lower limit to an upper limit, which are designated $f_s$ and $f_n$ to correspond with FIG. 4. After reaching the upper frequency $f_n$ at time T, the variation may be repeated starting again at $f_s$, either immediately or after a delay period. Desirably and as shown the frequency sweep is substantially linear and continuous, but other predetermined variations may be used. The lower graph of FIG. 8 illustrates a response signal which might be produced by the target field and detected in signal processor 32. This signal shows differences from the background signal, which are illustrated as spikes but might take a variety of forms. The lower graph illustrates a significant feature of the swept-frequency measurement, namely that identifying data may be easily detected by measuring the time at which the spikes or other resonant effects occur in the response.

In the terms of the FIG. 4, if the frequency band is partitioned into 10 windows, with the low frequency window representing a start bit and 9 data bits ranging from a low order bit at $f_1$ to a high order bit at $f_9$, the data word represented by the response in FIG. 8 is 100001000. Such a serial data structure can be easily and inexpensively evaluated. The expense of detection equipment may be reduced by use of a start bit frequency as described or other data structure which similarly permits evaluation by relative rather than absolute frequency determination. This avoids the difficulty and expense of making high resolution, high precision frequency measurements at high frequencies.

The lower graph of FIG. 8 shows a response signal with identification information present in the form of spikes having greater amplitude than the received signal at other frequencies. It should be noted that the response signal may provide troughs or notches at particular frequencies, such as where the resonator absorbs energy at the resonant frequency. All that is required is that the resonator provide a detectable difference in response signal at an identifiable frequency, whether the response is greater or less than at other frequencies.

It should be noted that low average power levels can be maintained while using larger measuring signals by transmitting a high power interrogating signal with a small duty cycle. For instance, an interrogating signal which is swept from the low frequency to the high frequency in a 1 millisecond interval and then turned off for 9 milliseconds, to yield a 10% duty cycle, will increase by a factor of 10 the response signal level available from a given average transmitted power level.

System according the foregoing are applicable to a wide range of target and identification applications. For instance, the resonators may be extremely small, on the order of the wavelength of the interrogating signal. Resonators of onehalf wave dimensions at frequencies on the order of 10–100 GHz are quite small, and large numbers of them may be used to provide high density identifying data, far greater than the 9 bits used as illustrations in connection with the above descriptions of drawing figures. A particularly desirable mode of application of an identifying set of resonators is in a matrix of adherent radio frequency transparent material, forming an encoded "ink". Such an ink may be applied to a wide variety of types of materials to target them for identification. One application which deserves particular mention is in identifying documents. An ink comprising radio frequency resonators may be applied to a wide variety of documents to tag or identify them. Applications range from substitutes for barcodes or printed indicia, such as on checks and currency, to inclusion in toner to permit monitoring and/or identification of xerographically copied documents, laser-printed documents, or other documents whether printed by thermal set techniques or otherwise. Crystals or sets of identifying crystals may also be microencapsulated, or included in the bulk of a material to be identified.

Another application area which deserves particular mention is modification of target response characteristics. This is done in the prior art, for instance in deactivation of retail theft control tags and labels. The system of the present invention likewise permits modification of target response characteristics, for instance to deactivate a target or otherwise alter the information it contains. A system for modifying target response characteristics is shown in FIG. 9. A resonator 60 is coupled to a resonance characteristic modifying means 64 by a coupling means 62 which may be altered by external influences to vary the coupling between the resonator and the resonance modifying means. Upon application of the appropriate stimulus to the coupling means 62, the resonance characteristics of the entire system of FIG. 9 are altered to change the information provided. One or more such systems may be included in a target to provide the capability of changing the target information.

One possible example of a system according to FIG. 9 is a quartz crystal which is microencapsulated in a heat-deformable medium functioning both as a coupling means and a resonance altering means. At low RF power levels, the mechanical coupling between the encapsulation and the resonator affects the natural resonance characteristics of the resonator. Application of RF power levels sufficiently high to generate heat due to movement of the resonator can result in deformation of the encapsulation medium and thereby change the coupling and resulting effects of the encapsulation medium on resonance characteristics. This change can be interpreted as a change in information. Another example of an alterable resonator is a pair of crystal resonators which are mechanically coupled by a heat deformable medium. When united, the resonators together provide a first resonant frequency. When high power levels are applied at resonant frequency, resulting heat can deform the coupling medium and permit the component resonators each to resonate at their own resonant frequencies, thus providing a change in information contained in a target.

Figure 10:
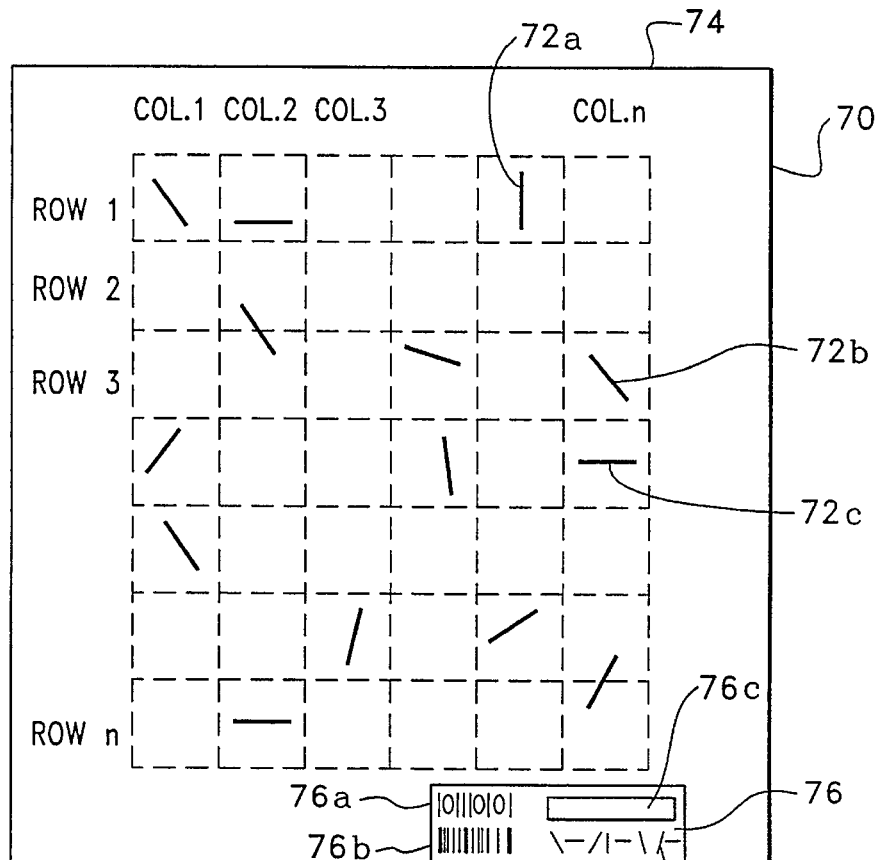
FIG. 10 is a schematic illustration of a document having information which is encoded by location of resonators.

FIG. 10 illustrates various aspects of the invention, in accordance with which the spatial locations of resonant articles in a target provide the target with information and are detected in order to obtain information from targets. These aspects are particularly useful for identification of items comprising or consisting of a target which may be easily brought into a closely adjacent relationship with a transceiver reading device to facilitate spatial differentiation of the resonator locations within the target. An example of such an application is the identification of documents, which provide a two-dimensional area that may be encoded with resonators and that may be discretely handled using known document handling techniques. Another example is credit cards and like card-size instruments which have traditionally been fabricated of plastic and encoded by magnetic means, which can be handled by known card handling apparatus. Labels or tags which may be applied to the surface of an article to identify it may also be spatially encoded with resonant articles. All of such specific embodiments may be referred to herein by the generic term "document". As has been noted, the resonant frequencies of the resonators may also be used to impart information to the target in these aspects of the invention.

FIG. 10 illustrates a document 70 which has been encoded with information in the form of the location of a set 72 of resonant articles 72a–72n which are affixed to the document. The resonant articles 72 are depicted as line segments in that a preferred type of article is a thin dipole such as an elongated metal or metallized article in the nature of chaff. Such a dipole is resonant at an interrogating frequency at which the dipole is ½ wavelength in length. Metallized glass fibers may be used as the thin dipoles; the fibers may be on the order of 0.001" diameter. A wide variety of lengths may be used depending on the resonant frequency desired and the nature of the reader, but lengths for example on the order of ¼ inch may be used.

FIG. 10 illustrates, by dotted lines, a rectangular array of rows 1, 2, 3 . . . m and columns 1, 2, 3, . . . n. This m×n array is not necessarily an attribute of the document 70, although it may be; in general, it is established by the encoding/decoding (or "coding") scheme and defined by the scanner or reader with which the document 70 is to be read. While it is possible to precisely measure the spatial location of each resonator present in the document, in one preferred embodiment this difficult task is avoided by detecting the presence of resonators within spatial "windows". That is, under a particular coding scheme, the preferred reader will interpret the presence or absence of a resonator anywhere within a predetermined area of the document 70 comprising the array element (m, n) as a bit of information. The bits of information may be organized as a single data word, or as a plurality of words (for example, each row or column may be considered a byte). As described more fully below with respect to the reader, the origin of the array may be determined with respect to the location of resonators in the document containing "start" data or with respect to the document itself, e.g. with respect to the document edges.

Figures 12B, 12C:
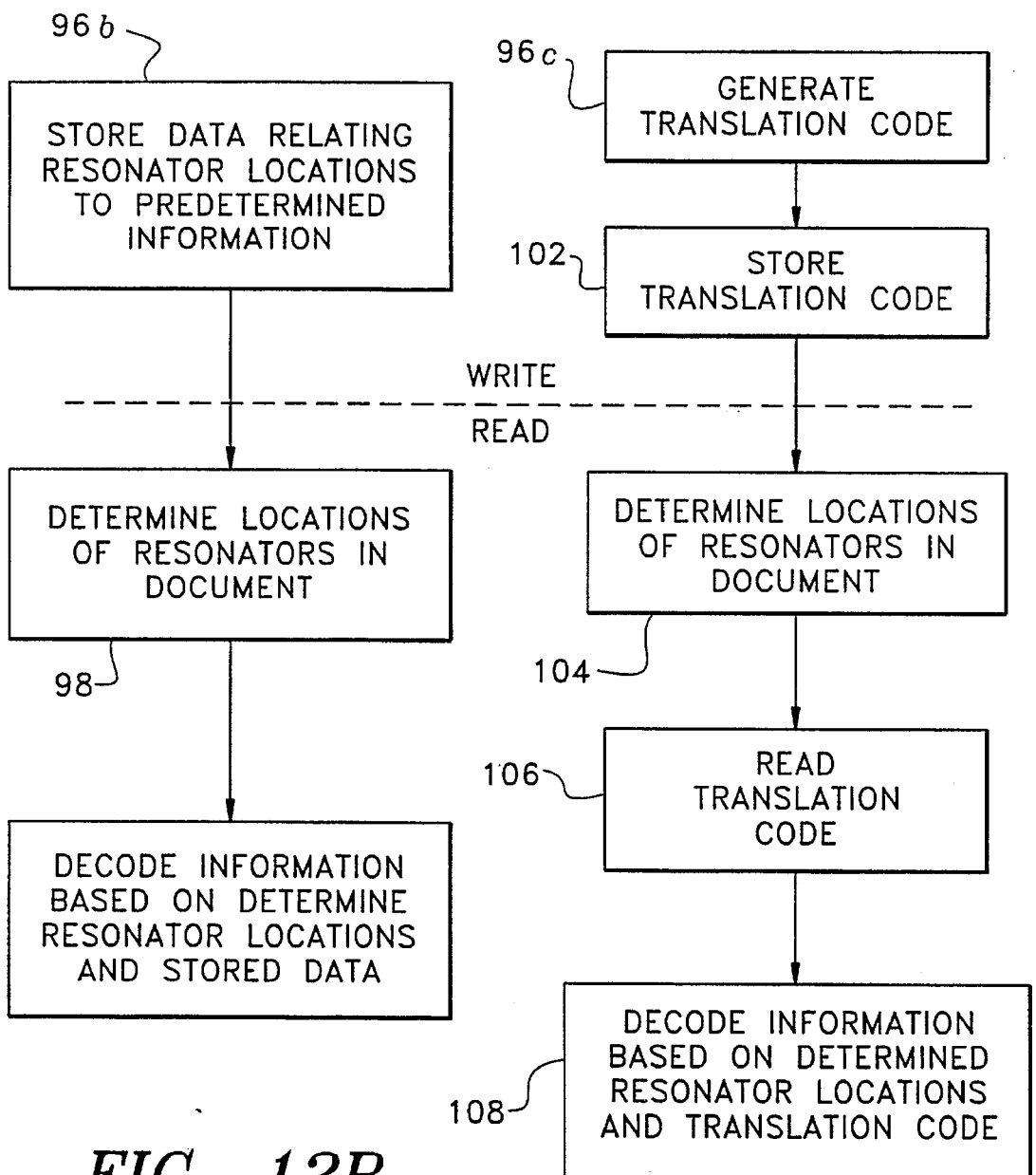

FIG. 11 and FIG. 12 (comprising FIGS. 12A, 12B, and 12C) illustrate two alternative general methods of providing a document having information encoded by the spatial location of resonators in it. Each of these figures is divided by a horizontal dotted line into an upper portion comprising steps to "write" or create the encoded document and a lower portion comprising steps to "read" a document and, if it is readable, to decode the encoded information therein. In the method of FIG. 11, the document is encoded by disposing resonators at predetermined locations; in the methods of FIG. 12, the document is encoded by disposing resonators at random locations.

In the flow diagram of FIG. 11, resonators are first fabricated in step 80 to provide a supply of resonators suitable for inclusion in a document to be identified. In step 81, a coding system is determined which is to be used in encoding the document. The coding system associates predetermined information with predetermined spatial locations in the document, and may be selected from a set of coding systems which are available for use. In step 82, the information which is to be encoded in the document is determined. In step 83, the spatial locations in the document are determined which will encode the particular information to be encoded (as determined in step 82) in accordance with the particular coding system to be used (as determined in step 81). In step 84, resonators are disposed in the document at the locations determined in step 83. Step 84 may be effectuated by disposing the resonators in the document as the document base material is being fabricated, as for instance by dispensing resonators from a supply into a web of paper pulp (e.g. for currency) or soft plastic (e.g. for cards) while it is in a somewhat fluid-like condition as it is being formed, and prior to application of printing or magnetic coding materials. Step 84 may also be effected by applying and adhering the resonators to the document after the base material has been fully formed, either before or after any printing, magnetic material, or other non-resonant information-bearing materials have been applied to the documents. After completion of step 84, the document has been "written" by providing resonators at information-bearing predetermined spatial locations.

The reading steps 86 and 88 of FIG. 11 may be performed using a reader such as that described below with respect to FIG. 13. In step 86, the locations of resonators in a document are determined. This may include a discriminating step, in which the characteristics of each resonator are determined to determine whether it is genuine or to discern further information, e.g. from the frequency of the resonator. In step 88, the coding system which should apply to the document (if it is genuine and was properly encoded) is used to decode the information present in the document, if any, under the coding system based on the resonator locations determined in step 88.

Because it may be difficult or expensive to control the location at which resonators are disposed in performing step 84 of the method of FIG. 11, in such circumstances the methods of FIG. 12 may be preferred. In step 90, resonators are fabricated to provide a supply of resonators. In step 92, resonators are disposed in the document at random or uncontrolled locations. Step 92 may be effected during or after formation of the document base material, and before or after application of other information-bearing materials such as printing or magnetic materials. In step 94, the locations of the randomly-disposed resonators in the document are determined, such as by passing it through the reader of FIG. 13. In step 95, the information which is desired to be encoded in the document (i.e. the information which is to be represented by the resonator location) is determined. In step 96, this determined information is attributed to the spatial locations of the resonators which were determined in step 94.

Step 96 may be effected in several ways; one such way is illustrated in FIG. 12B, and another is illustrated in FIG. 12C. Each of these figures includes the reading steps which are appropriate to the particular information attribution method illustrated.

In FIG. 12B, the information attribution step 96B is to store data which relates the resonator locations in the document to the information which is to be attributed to the document. This may be done, for instance, in a digital memory which comprises the reader or which receives information from the reader. Such data may be organized as a lookup table. The associated document reading process first is to determine in step 98 the locations of resonators in a document to be read. Then in step 98 the stored data is examined for data representing the determined locations, and if such location data is found, the associated information is extracted from the stored data to decode the document. In a simple example, where the only information of interest is genuineness, the stored data may merely consist of the locations of resonators in each genuine document created using the writing steps. During the reading process, if a data entry is found for such locations, the document is determined to be genuine or authentic; if not, it is determined to be a forgery or non-authentic. The method of FIG. 12B requires that the reader contains or has access to the stored data generated during the writing process.

The method of FIG. 12C may be preferred when it is desired to output the information obtained from the document by the reader in a particular format, without the necessity of storing location and information data for each genuine document (as is done in step 96B). Thus, in step 96C, a translation code is generated. The translation code is an algorithm or data for use in a predetermined algorithm which, when applied to the location information of a document, provides in a predetermined format the information desired to be attributed to the document. The translation code is thus unique for each different set of document resonator locations and each different piece of formatted information to be attributed to a document. In step 102, the translation code is stored to complete the writing process. In step 104, where the reading process commences, the resonator locations in a document to be read are determined. In step 106, the stored translation code is read. In step 108, the information in the document (if any) is determined by applying the translation code to the determined resonator locations to decode the information.

An example illustrating the differences between the methods of FIGS. 12B and 12C is credit card validation. A system may be provided including readers at a large number of disparate locations, such as merchant facilities, each of which desires the capability to determine if a card presented is a genuine card. The validation method might be to present information to the merchant in a format which can be compared with that printed on the card—for instance, card number and expiration date in arabic numerals, cardholder name in English characters, and the like. In the method of FIG. 12B the merchant, upon reading the resonator location of a card, would require access to the database comprising stored data for all valid credit cards in order to look up the location information from the presented card and obtain the formatted attributed information. Such a large amount of information may be impractical to store in a merchant's reader, and accordingly resonator location information and decoded information would have to be interchanged between the merchant used and a large central database. In the method of FIG. 12C, the translation code storing step 102 may be effected by storing the code on the card itself. While the translation code might be stored in resonators disposed in the card, difficulties in placing resonators at predetermined locations may be avoided by storing the translation code in another format and medium, such as by printing, bar coding, or magnetic encoding. Each merchant reader need only be provided with a means for applying a translation code to the determined resonator location data (and perhaps also means for automatically reading the translation code) in order to decode the resonator information and present it to the merchant in the desired format. This can be done autonomously by the merchant's reader, without any access to a central database.

FIG. 10 illustrates a translation code associated with the document 74. The translation code is disposed in an area 76 within the document; this area may be an integral part of the document itself, or it may comprise a label or the like which is generated and applied to the document 74. The translation code may be encoded in alphanumeric characters 76a, bar code symbols 76b, a magnetic stripe 76c, radio frequency responsive articles 76d, or other formats. Such formats may be used individually, or a combination of them may be used.

Figure 13:
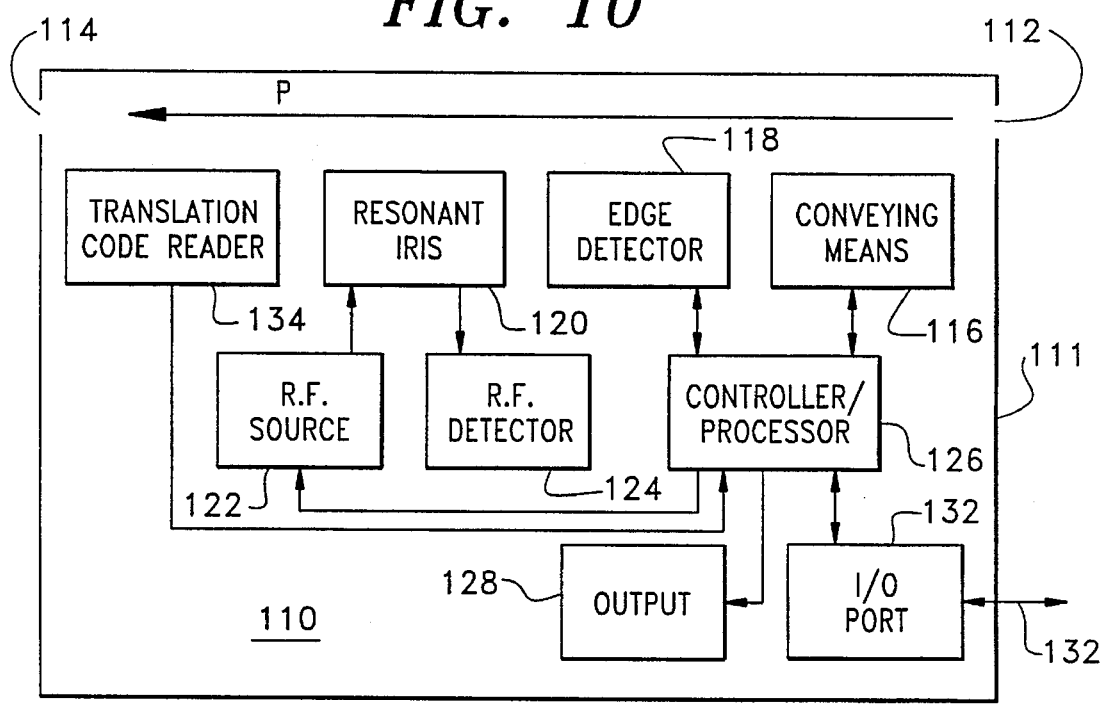
FIG. 13 is a block diagram illustrating the functional elements of a document reader in accordance with the invention.

FIG. 13 is a schematic illustration of a document reader 110 which may be used to read documents such as that shown in FIG. 10 by methods such as those shown in FIGS. 11 and 12. The reader components are contained within a housing 111 which includes an entrance 112 for receiving a document to be read, and conveying means 116 for conveying the document along a path P from entrance 112 to exit 114. A radio frequency source 122 is coupled to a resonant iris aperture 120 which is disposed adjacent the path P. At least one, and preferably a plurality, of such resonant irises 120 are included. When a plurality of irises 120 is used, the resonant frequencies thereof may be the same or different. An RF detector 124 such as an envelope detector is disposed so as to detect the radio frequency energy emitted by source 122 as preselected by iris 120. When a dipole taggant covers the aperture of iris 120 as the taggant-containing document is moved along the path P, it creates a low impedance, which may be near a short circuit, at the aperture. This condition creates a large reflection of the illuminating RF energy and greatly reduces the RF voltage in the aperture while the energy remains constant. This condition may be detected by placing the detector on the source side of the path P (as shown in FIG. 13) and detecting the energy reflected from the iris, or by placing the detector on the opposite side of the path P from the source 122 and detecting the energy transmitted through iris 120. The operation of the reader 110 is controlled, and the information extracted from a document is processed, by a controller-processor 126. This functional block may be implemented by a variety of microprocessor-based systems, the construction of which is believed to be a straightforward matter for those skilled in that art. A suitable system may include a microprocessor, a memory containing a stored program for operating the system in accordance with this invention, and suitable interface devices to interface the microprocessor with other functional blocks shown in FIG. 13.

The longitudinal position of a resonator in a document being scanned may be determined by correlating the maximum low-impedance effect detected by RF detector 124 with the position of the document along the path P. For instance, in the embodiment shown in FIG. 13, an edge detector 118 is provided which outputs a signal to controller/processor 126 when a document edge passes the edge detector 118. Such an edge detector may for instance be made from a light source and photodetector arranged so that a light path from the source to the photodetector is occluded by a document being conveyed along path P. The controller/processor 126 may determine the document edge position with respect to edge detector 118 at any time by integrating the document speed along path P from an edge detection event to a time of interest. The document speed may be determined by the controller/processor either in response to a speed signal transmitted from the conveying means 116 to the controller/processor 126, or from control signals transmitted to the conveying means 116 if its speed is controlled by the controller/processors 126. The position of the document edge with respect to iris 120 may be computed in accordance with the iris-edge detector separation.

As has been indicated, the edge detector 116 may be dispensed with and other means employed to establish a spatial frame of reference for determining the position of taggants in the document. Such other means include using RF detector 124 to detect a "start" taggant in the document, or using other types of detectors (such as optical detectors) to detect printing or other features which provide one or more spatial reference points on the document.

Figure 14:
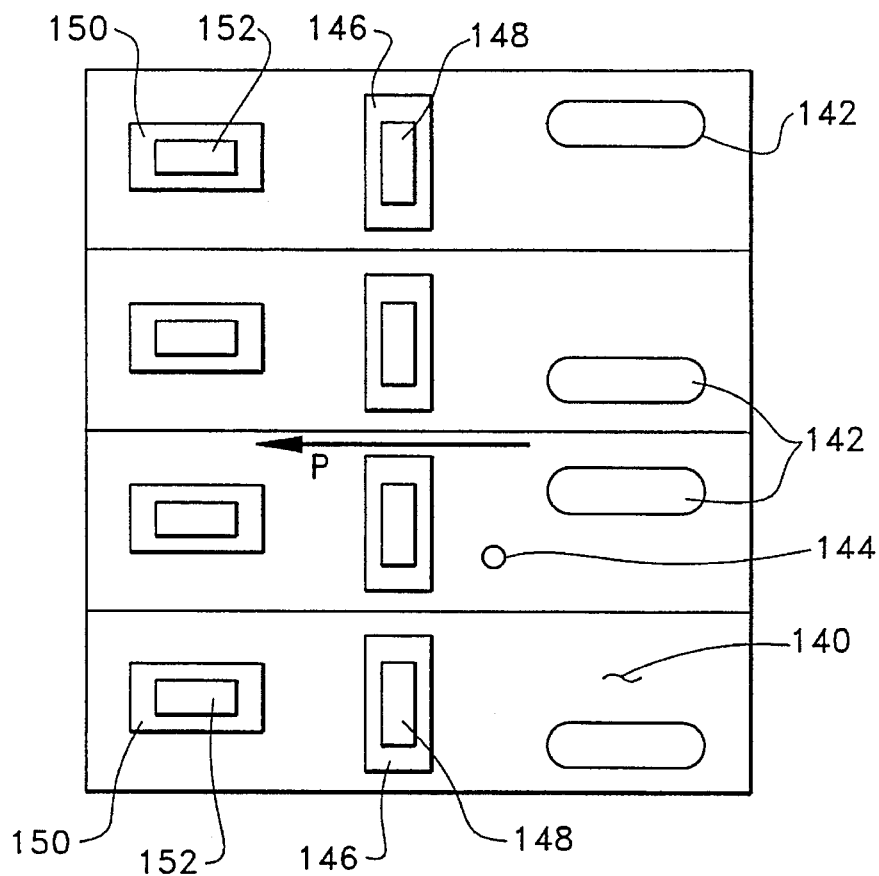
FIG. 14 is an illustration of a document interfacing surface useful with the document reader of FIG. 13.

In the preferred embodiment of reader 110, each iris is fixed in position, and thus is capable of reading one column of the document when it is inserted into entrance 112 and conveyed with edge 74 leading. A plurality of irises 120 (with associated sources 122 and detectors 124) is thus preferably provided, each of which is laterally disposed along path P so as to be capable of reading one column of the document. Such an arrangement is illustrated in FIG. 14, which is discussed later. However, it will be recognized that other methods and types of apparatus may be used to detect the spatial locations of taggants over a two dimensional area of the document. For instance, a single iris 120 may be moved laterally back and forth to sweep or scan each row as the document is advanced along path P, or the document may be maintained at a fixed position in reader 110, and a single iris 120 moved both laterally and longitudinally, over the entire surface of the document, thus dispensing with the need for document conveying means 114. While such readers would minimize the RF apparatus needed, it is believed that the mechanical complexities would render them less preferable than a reader such as is shown in FIG. 13. On the other hand, mechanical complexities may be minimized by eliminating the need for relative movement between the document and the irises 120, by providing one iris (with associated RF source and detector) for each grid element (i,j) where a taggant might be disposed in the document coding system. However, except for systems using only a small number of possible taggant positions, the expense and complexity of providing many RF systems is believed to render such an approach less preferable.

Once a spatial reference for the document in the reader 110 has been established, the longitudinal positions of taggants 72 in the document can be determined by controller/processor 126 based on the times at which RF detector 124 detects impedance minima in iris 120, and the speed of movement of the document along path P.

In general, the surface of the document is mapped in software in controller/processor 126 to grid or array coordinates (i,j). Each grid element (i,j) is assigned a binary value (1 or 0) in accordance with whether an impedance minimum was detected in the document in a position corresponding to that grid element. The assignment of data bits to grid elements may be effected in a variety of ways. For instance, the times of impedance minima may be measured and compared with limits of time "windows" applicable to the spatial boundaries of the grid elements. Alternatively, a data storage device such a latch may be provided for each grid element and enabled for a predetermined time interval corresponding to the time interval when the grid element is over the iris; a comparator coupled to the data storage element may provide a logical output in accordance with whether the iris impedance crosses a threshold value, which logical value is stored in the data storage element.

The reader 110 includes an output 128 for local output of information obtained by reading a document; for instance, output 128 may be an alphanumeric visual display. The reader 110 also includes an I/O port 130, such as a modem, by which information obtained by reading a document may be transmitted to a remote location over communication channel 132. It will generally be preferable to output information obtained from the document in a predetermined and convenient format, rather than as a binary string or series of binary words comprising the raw data of whether or not a taggant is present in each grid element. Thus, the controller/ processor 126 preferably includes means such as a data processing algorithm for performing the decoding steps 88, 100, or 108 of FIGS. 11, 12B, and 12C, respectively. If the method of FIG. 12C is to be employed, the reader 110 preferably includes a translation code reader 134 for automatically reading the translation code of a document and supplying the translation code for use in performing step 108. A light source 144, such as an LED, forms part of an edge detector 118 along with a photodetector (which typically would be disposed above the path P and is not shown).

FIG. 14 shows a plan view of a document-interfacing surface which may be used in a document reader such as that shown in FIG. 13. While the reader 110 in FIG. 13 is shown in block form, the plan view of FIG. 14 corresponds to a view downwardly from the path P toward the iris 120, edge detector 118, and conveying means 116 shown in FIG. 13. A plurality of feed rollers 142, driven by suitable means (not shown) such as a motor, comprise conveying means 116 and are disposed to convey a document along surface 140 in contact with or closely adjacent surface 140. Each such feed roller 142 may be disposed adjacent a cooperating driven or idling roller (above the path P and therefore not shown) to define a nip through which the document passes and is conveyed by rotation of the rollers 142. Other well-known document-conveying techniques, such as belt systems, may be employed. Disposed in surface 140 are a plurality of RF apertures each provided with a resonant iris aperture and illuminated from below by an RF source, not shown. At least one such aperture and iris is provided for each column of the grid array (see FIG. 10) which is defined in the coding system to be used. Preferably, and as shown in FIG. 14, two irises are provided for each column: a vertically polarized aperture 146 and iris 148, and a horizontally polarized aperture 150 and iris 152. Use of both horizontally and vertically polarized components is preferable whenever the orientation of taggants in the document is variable. For instance, as shown in FIG. 10, the dipoles 72 are disposed at a variety of angles ranging from 0° to 360°. This may result from either random disposition of dipoles or from purposeful disposition at predetermined angles. The detection of a dipole is generally a cosine function of the dipole angle with respect to the polarization axis of the iris. Thus, the dipole 72a of FIG. 10 would have a maximum short circuiting effect when adjacent iris 148 and a minimum impedance effect when adjacent iris 152; the converse would be true for dipole 72c. Thus, the orientation of dipole taggants in the document may be used in addition to the grid location to encode information in the document, and the use of both horizontally and vertically polarized antenna elements enables determination of the angle of orientation of the dipole to decode such information. Where the dipole orientation is not used to encode information, the use of both horizontally and vertically polarized antenna elements ensures that a detectable impedance change occurs in at least one of the irises, so that dipoles may reliably be detected regardless of their orientation.

Figures 15, 15A:
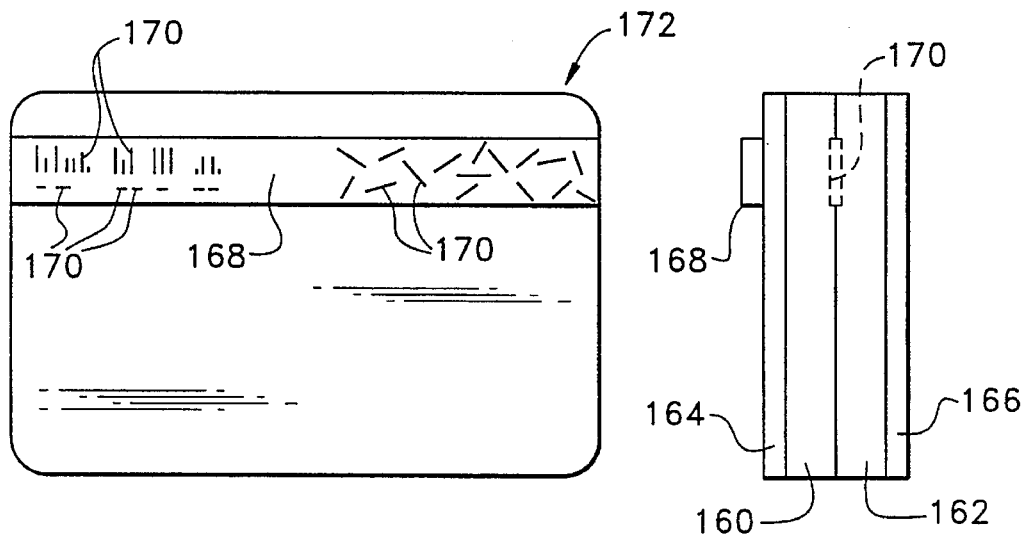
FIG. 15 is front elevation and FIG. 15A is side elevation of another document which has information encoded by the spatial location of resonators.
Figure 16:
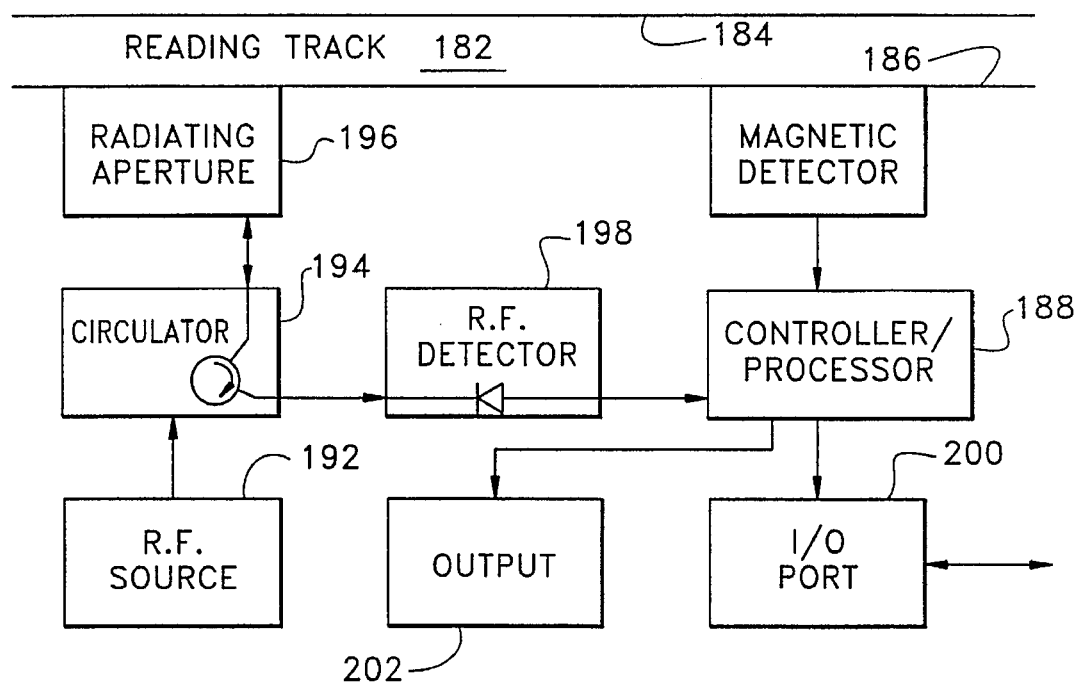
FIG. 16 is a diagram of another document reader, which may be used to read the document of FIG. 15.
Figure 17:
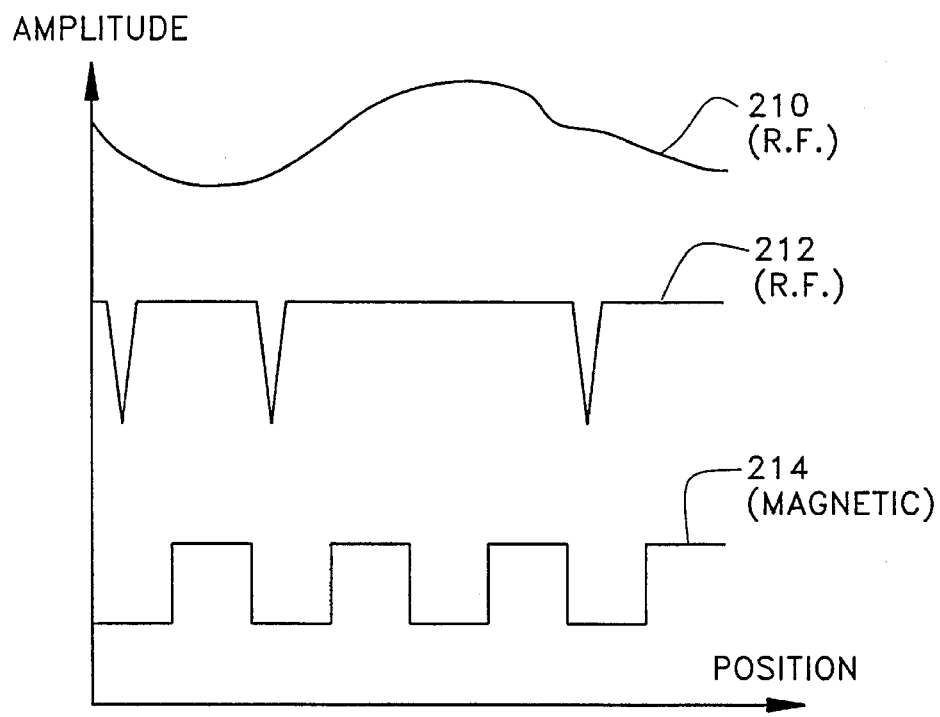
FIG. 17 is an illustration of various signals which may be generated by reading the document of FIG. 15.

A modification of the invention which is particularly desirable for use with credit cards and similar documents is illustrated in FIGS. 15–17. FIG. 15 shows the "back" side of a card 172 such as a credit card, and FIG. 15A illustrates a side view of the card which is, for convenience, exaggerated in thickness. The card is generally of conventional construction and includes a pair of inner plastic layers 160, 162 which may for instance be made of 0.012" thick opaque PVC sheet and a pair of outer plastic layers 164, 166 which may for instance be made of 0.0005" thick transparent PVC sheet. Printing may be disposed between the inner and outer layers, and the outer layers serve to protect the printing while maintaining it visible. Card 172 may have conventional data storage means such as magnetic stripe 168.

Card 172 differs from conventional cards in that it includes a plurality of resonant articles which encode information by their positions in the card. Preferred resonant articles are thin dipoles 170 of the sort which have been previously described, i.e. metal or metallized fibers. The resonant articles may also comprise metal or conductive structures which are disposed on a nonconductive substrate, as described below with respect to FIG. 18. Dipoles 170 may be disposed at any location in the card, but a preferred location is between the inner layers 160, 162; they may be placed there during manufacture prior to lamination of the inner layers, either by being disposed at predetermined locations to encode particular information, or by being randomly disposed. They may be generally uniformly distributed over the card area, or as shown be generally confined to a predetermined area. A particularly preferred location for data-encoding resonators 170 is the area adjacent the magnetic stripe 168, as shown in FIGS. 15 and 16. This location is preferred for several reasons, including making it difficult to attempt to duplicate a card but primarily so that the card may be read both magnetically and at radio frequency by "swipe"-type credit card readers. Such a card reader which can read both types of encoded data is illustrated in schematic form in FIG. 16.

The reader includes means for reading both magnetic data included in a magnetic stripe upon the card, and for reading RF data from the card. The apparatus may be built as a swipe-type reader, in which a person grasps the card along one edge, places the opposite edge in a slot or reading track in a card reader, and moves the card manually along the slot past stationary reading devices disposed in the slot walls. The slot or reading track 182 in FIG. 17 includes a pair of side walls 184 and 186, and a magnetic detector 190, such as a magnetic stripe read head, is disposed along one of the walls so as to be adjacent the magnetic stripe when a card is "swiped" through the slot. The output of the magnetic detector 190 is provided to a controller/processor 188, which can process received data, generate outputs on a local output device 202 such as a visual display, and communicate with other devices if desired by means of an I/O port 200. In addition to these normal functions of a magnetic card reader, the apparatus of FIG. 16 also includes RF reading apparatus. The preferred apparatus shown in FIG. 16, includes an RF source 192 which feeds a radiating aperture 196 through a circulator 194. The aperture 196 is disposed in a wall 186 of the slot 182. RF energy propagates from source 192 through circulator 194, through antenna aperture 196, and through the space in the slot to the opposite wall 184 of the slot. The slot wall 184 reflects energy back to antenna aperture 196, where an appreciable amount of the energy is collected and propagates back through circulator 194 to RF detector 198, which may be a diode functioning as an envelope detector. The apparatus functions as a transmission line with a standing wave.

The RF reading apparatus is mechanically positioned to peak the power at the detector 198 when there is nothing in the slot 182. This can be effected by making the gap between detector 198 and opposing wall 184 ¼ wavelength at the frequency of operation, which may be on the order of 25 GHz. When a card containing thin dipoles is passed through the slot 182, the dipoles nearly short the aperture and shift by approximately 90° the phase of the standing wave in the transmission line. The resultant drop in energy is detected by RF detector 198, and the detected signal is provided to controller/processor 188. The spatial positions along the card where such drops in energy occur can be very precisely measured because the detection system detects the nulling of the standing wave in the RF transmission line. This permits very dense packing of RF articles and a large data capacity.

The combination of magnetic data and RF data in a single card which can be read by a single reader provides several advantages. First, the magnetic stripe may be used to store translation code data, for use in the encoding systems as previously described. Second, magnetic stripes in common use in credit cards contain clocking data which can be used to establish an appropriate spatial frame of reference for the RF measurement. While the reader of FIG. 13 includes document conveying means which permit controlling or measuring the speed of the document as it is moved past the RF detectors, in order to corollate spatial position with detected RF data, a swipe-type card reader lacks document conveying means. In order to account for variations in the speed with which a card is moved through the slot, with the apparatus of FIG. 16 the detected RF signals may be time correlated with detected magnetic signals including magnetic clocking signals. These can be used to establish a spatial framework for the encoded RF information.

FIG. 17 is a graph illustrating various signals which may occur in the reader of FIG. 16. The horizontal axis is positioned along a card being read, and the vertical axis is signal amplitude. Waveform 214 illustrates a clocking signal which may be stored in the magnetic stripe. Waveform 212 illustrates an RF signal provided by detector 198, including drops in energy caused by the presence of three dipoles at different spatial locations along the card. Such a signal may result from dipole placement as illustrated on the left side of the card of FIG. 15, in which the dipoles are placed so as to be separately distinguishable. When dipoles instead are randomly distributed, as for instance is shown in the right side of the card of FIG. 15, then the multiple reflections created by plural, randomly oriented dipoles in the antenna field, result in a smoother RF amplitude versus position waveform as illustrated in waveform 210 of FIG. 18. The amplitude versus position characteristics of this waveform may be used to uniquely identify the card. Moreover, information may be attributed to the data obtained by sampling the detected RF amplitude at predetermined spatial locations and attributing information to the detected amplitudes.

While reader apparatus is illustrated in FIG. 16 with a single RF detection system and a single magnetic detection system, it will be understood that a plurality of RF systems can be included, including systems which are differently polarized, operate at different frequencies, and the like. A plurality of magnetic detectors may be provided, so that the card is never being moved past an RF head without magnetic data being simultaneously obtained so as to permit position determination. Finally, it will be understood that the magnetic and RF heads may be located along either slot wall at any position which is suitable for carrying out the necessary measurements.

Figure 18:
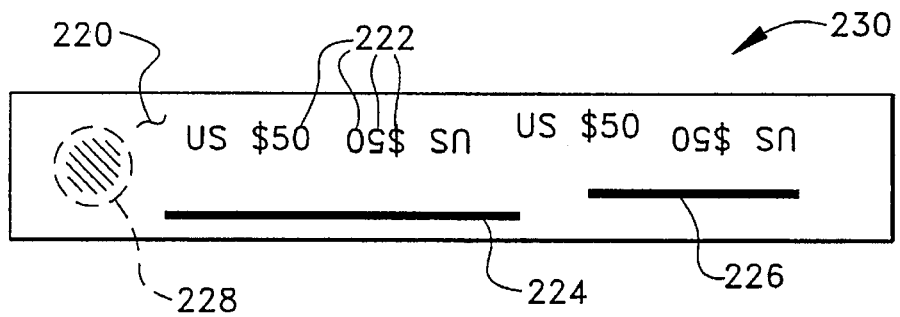
FIG. 18 is an illustration of a tag or target in which a plurality of RF responsive articles are disposed on a substrate.
Figure 19:
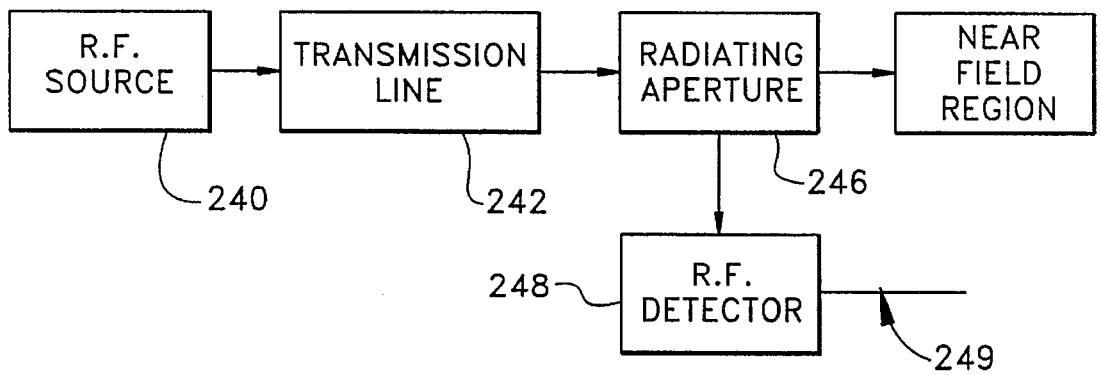
FIG. 19 is a block diagram illustrating the function of a near field radio frequency reading system in accordance with the invention.

FIG. 18 illustrates a type of target which can be advantageously used in many RF/AID applications. The target consists of a substrate 220 upon which a plurality of resonant structures are disposed. A preferred form of target substrate is a thin plastic sheet, for instance, 0.0005" thick polyester or PVC film. The RF responsive structures which are disposed upon the substrate are preferably metal structures, for instance, made of aluminum. FIG. 19 shows a substrate 220 upon which several types of RF responsive metal structures are disposed. Thin dipoles can be disposed on the substrate; dipoles 224 and 226 shown are resonant at different frequencies because of their different lengths. More complicated structures can advantageously be used; these include structures 222 having the shape of letters, numbers, or other characters or symbols. Such structures, in addition to conveying information which can be determined by visual inspection, also have radio frequency resonances associated with the size and shape of the character. Thin films with aluminumized characters, such as shown in FIG. 19, are in use in U.S. currency as an anti-counterfeiting measure and such structures per se are not a part of this invention. However, in accordance with the invention, such structures can be read at radio frequency and authenticated by correlating the actual radio frequency response with the expected response for such a predetermined character set. When the character set is predetermined, as with present currently, then a reader can be provided in advance with information as to the expected RF characteristics of the character set. When the information to be included in the target is not uniform and predetermined, then the resonant structures can be read optically and at radio frequency, and the results correlated in order to authenticate the target. Other structures which are sized and shaped to provide specific RF resonant responses can be disposed upon the substrate 220. For instance, the metallizations 228 provide both resonant frequency and phase information.

A given target may contain one or several different types of RF responsive structures, as appropriate to the application. Depending on the type of resonators included in the target and the information-containing aspects of the resonators, they may be read by a wide variety of reader devices, including a far-field frequency-responsive reader, or a near-field reader such as is shown in FIG. 13 or 17. The target of FIG. 19 may thus function as the target 12 of FIG. 2, or the document of FIG. 10, or may be laminated between the layers of the card of FIG. 15 to provide the RF responsive data component.

The target of FIG. 19 may be manufactured by a variety of techniques. These include coating a plastic film substrate with a thin layer (e.g. 300 Angstroms) of metal by vapor deposition or the like; areas where metal is to remain in a finished target are protected by a printed resist or an exposed and developed photo resist, and the remaining metal areas are removed by chemical etching.

FIG. 19 is a block diagram illustrating the general function of a preferred radio frequency reading system in accordance with the invention. A radio frequency source 240 is coupled to a transmission line 242 and generates radio frequency signals which are conveyed along the transmission line. Transmission line 242 includes at least one radiating aperture 246 from which radio frequency signals are radiated into space. A radio frequency detector 248 is disposed so as to receive radio frequency signals which are affected by the presence of radio frequency responsive articles in the near field region of radiating aperture 246. Radio frequency reading devices may be built with RF detector 248 in a variety of different physical positions which will fulfill the function of providing output signals 249 having signal components which are responsive to the radio frequency conditions in the near field region of radiating aperture 246. Detection of signals which are responsive to radio frequency conditions in the near field region enable the positions and other characteristics of radio frequency responsive articles such as resonators to be determined. The readers illustrated in FIGS. 13, 14 and 16 include embodiments of the general system shown in FIG. 19.

Figure 20:
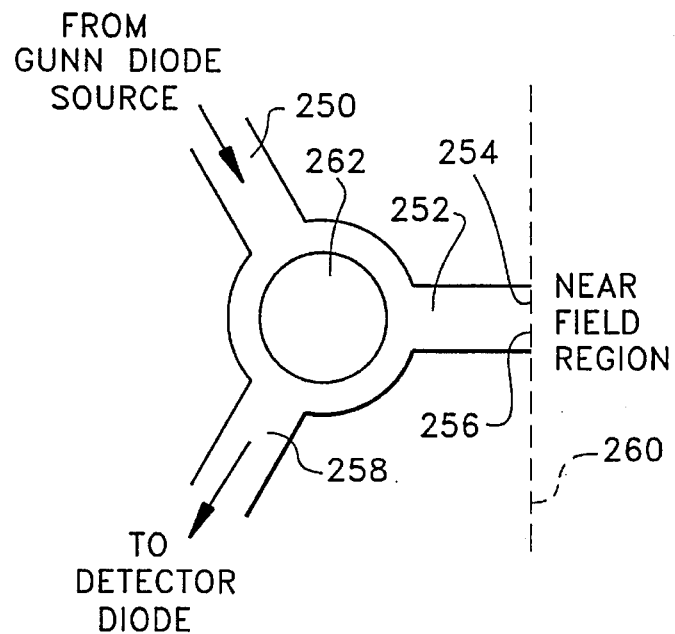
FIG. 20 is an illustration of a microwave reading system embodiment of the system of FIG. 19.

FIG. 20 is an illustration of a preferred microwave reading system having the functions illustrated generally in FIG. 19 and suitable for use in the readers of FIGS. 13, 14 and 16. In FIG. 20, a radio frequency source such as a Gunn diode supplies signals to a waveguide 250. The signals are directed from waveguide 250 to waveguide 252 by a ferrite circulator 262. Waveguide 252 terminates in an aperture 254 where signals are radiated into a near field region. The aperture indicated in FIG. 20 is aperture 254 in an iris 256. Use of an iris 256 is often desirable for a variety of reasons, but it need not be provided and the waveguide 252 may simply terminate to provide a radiating aperture. Signal returning to the apparatus from the aperture through waveguide 252 are directed by circulator 262 through waveguide 258 to a detector diode where they are detected. Circulator 262 thus acts as a duplexer enabling both the source and detector to be coupled to an aperture.

Rather than providing a conventional antenna to direct the radio frequency radiation from the aperture to a beam in the far field, in accordance with the present invention the apparatus may be used without such an antenna to read targets in the near field of the aperture. Thus, a target guide may be provided to position and/or guide a target for movement adjacent the aperture so that the radio frequency response characteristics of the target can be observed in small areas of the target, and thus the detected radio frequency response characteristics can be correlated with the position in the target having those characteristics, to read identifying data from the target. The signal path through waveguide 250, circulator 262, and waveguide 252 corresponds to and embodies the transmission line 242 of FIG. 19. The signal path in FIG. 20 from the aperture 254 to the detector diode is not indicated as a separate functional block in the general diagram of FIG. 19.

Figure 21:
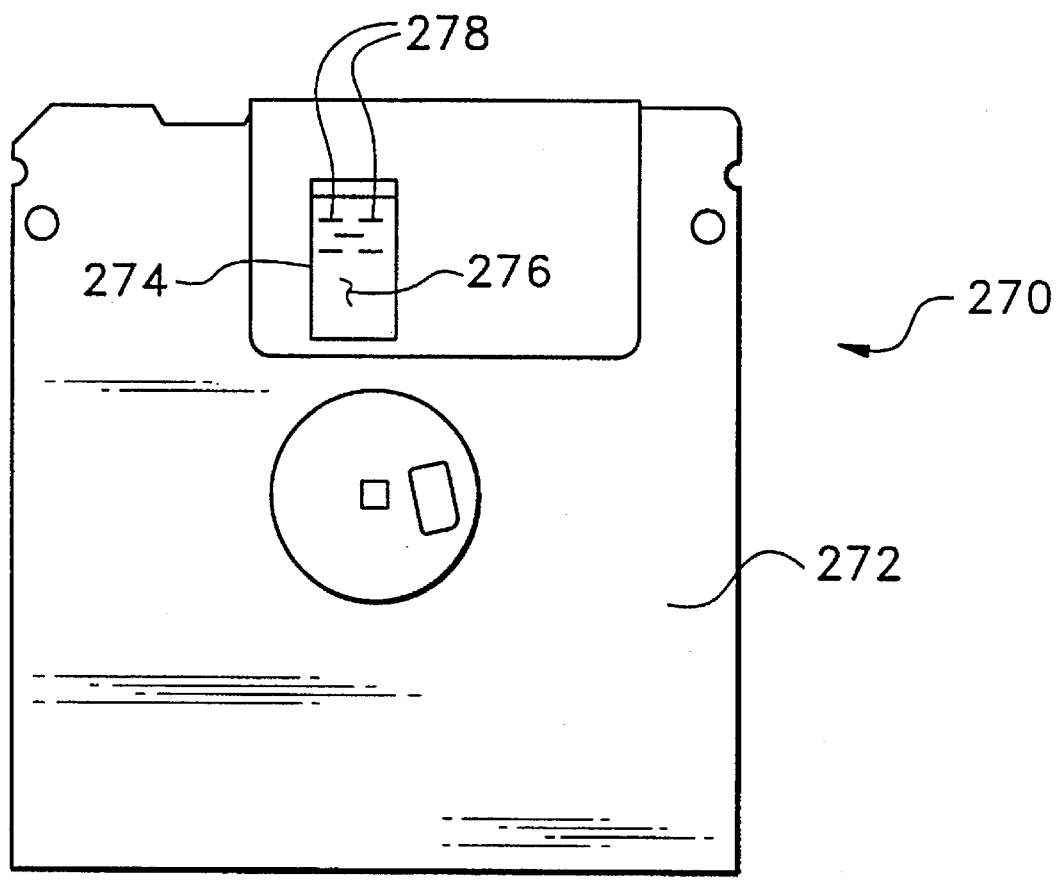
FIG. 21 is an illustration of a diskette encoded with radio frequency readable information.

FIG. 21 shows another application of the invention. FIG. 21 illustrates a microfloppy diskette of the type typically used as a removable read/write medium in computer applications. Mounted for rotation within the shell 272 of diskette 270 is a disk 276 having a thin layer of magnetic material which is disposed on the surface of a plastic substrate "cookie". In accordance with the invention, radio frequency responsive articles such as thin dipoles 278 may be incorporated on or in the disk 276 to provide identifying information. The diskette of FIG. 21 is in many respects similar to the card of FIG. 15, and may be tagged with identifying articles in the same manner. Thus, the radio frequency responsive articles may include thin dipoles in the nature of "chaff" or metallizations on the plastic disk substrate itself; they may be randomly deposited or disposed in predetermined spatial locations; and the resonant frequencies of the articles, in addition to their spatial positions, may be used to provide identification data. The articles may be disposed in the magnetic material itself as well as on the disk. Identifying data which may be provided in such a diskette 270 includes security data for purposes of preventing unauthorized copying of programs or data stored in the magnetic material on the diskette; for instance, radio frequency readable data may be used in an encryption algorithm which is used to encrypt and decrypt the information stored magnetically on the diskette. To use such a diskette, a drive having both radio frequency and magnetic read heads is required; such a drive can be made generally similar to those illustrated in FIGS. 14 and 16 with mechanical and other variations as necessary to suit the application. Application of the invention to computer diskettes is facilitated by the fact that diskette drives already include means for moving the diskette past a reading head. It is believed to be a relatively simple matter to provide a diskette drive with the additional capacity to read radio frequency encoded information.

While particular embodiments of the invention have been described, variations will no doubt occur to those skilled in the art without departing from the spirit and scope of the invention.

What is claimed is:

1. A target for authenticating a document, comprising: a plurality of thin dipoles disposed in a fixed arrangement on a substrate, each of said thin dipoles being formed of an elongated metal article having a random spatial position on said substrate, wherein said fixed arrangement of thin dipoles generates a composite RF waveform associated with said document when said plurality of thin dipoles are illuminated with RF energy.

2. The target of claim 1, wherein said plurality of thin dipoles are randomly disposed in said fixed arrangement on said substrate.

3. The target of claim 2, wherein each of said thin dipoles has a random angular orientation on said substrate.

4. The target of claim 1, wherein said fixed arrangement corresponds to an ordered arrangement of said plurality of thin dipoles on said substrate.

5. The target of claim 4, wherein each of said thin dipoles has an ordered angular orientation on said substrate.

6. The target of claim 1, wherein said thin dipoles are formed of metalized fibers.

7. The target of claim 6, wherein said thin dipoles are formed of metalized glass fibers.

8. The target of claim 1, wherein said thin dipoles are formed of aluminum.

9. The target of claim 1, wherein each of said thin dipoles is resonant at an interrogating frequency having a ½ wavelength equal to a length of said thin dipoles.

10. The target of claim 1, wherein said substrate is non-conductive.

11. The target of claim 10, wherein said substrate is selected from the group consisting of paper or plastic.

12. The target of claim 11, wherein said thin dipoles are disposed between inner and outer layers of plastic.

13. The target of claim 12, wherein said inner and outer layers of plastic represent first and second layers of an identification card.

14. The target of claim 13, wherein said identification card is a credit card.

15. The target of claim 1, wherein said substrate has a surface area and said plurality of thin dipoles are disposed throughout all of said surface area.

16. The target of claim 1, wherein said substrate has a surface area and said plurality of thin dipoles occupy only a portion of said surface area.

17. The target of claim 1, wherein said plurality of thin dipoles do not overlap on said substrate.

18. The target of claim 1, wherein said plurality of thin dipoles partially overlap on said substrate.

19. A method for forming a target for use in authenticating a document, comprising the step of disposing a plurality of thin dipoles in a fixed arrangement on a substrate, each of said thin dipoles being formed of an elongated metal article having a fixed spatial position on said substrate, wherein said fixed arrangement of thin dipoles generates a composite RF waveform associated with said document when said plurality of thin dipoles are illuminated with RF energy.

20. The method of claim 19, wherein said disposing step comprises the steps of:

(1) coating said substrate with a layer of metal to form a coated substrate;

(2) forming a plurality of exposed metal areas by applying a photo-resist layer to said coated substrate; and (3) forming said plurality of thin dipoles by removing said exposed metal areas from said substrate with a chemical etchant.

21. The method of claim 19, wherein said plurality of thin dipoles are randomly disposed in said fixed arrangement on said substrate.

22. The method of claim 21, wherein each of said thin dipoles is disposed at a random angular orientation on said substrate.

23. The method of claim 19, wherein said fixed arrangement corresponds to an ordered arrangement of said plurality of thin dipoles on said substrate.

24. The method of claim 23, wherein each of said thin dipoles has an ordered angular orientation on said substrate.

25. The method of claim 19, wherein said thin dipoles are formed of metalized fibers.

26. The method of claim 19, wherein each of said thin dipoles is resonant at an interrogating frequency having a ½ wavelength equal to a length of said thin dipoles.

27. The method of claim 19, wherein said substrate is non-conductive.

28. The method of claim 19, wherein said substrate is selected from the group consisting of paper or plastic.

29. The method of claim 28, wherein said thin dipoles are disposed between inner and outer layers of plastic.

30. The method of claim 29, wherein said inner and outer layers of plastic represent first and second layers of an identification card.

31. The method of claim 30, wherein said identification card is a credit card.

32. The method of claim 19, wherein said substrate has a surface area and said plurality of thin dipoles are disposed throughout all of said surface area.

33. The method of claim 19, wherein said substrate has a surface area and said plurality of thin dipoles occupy only a portion of said surface area.

34. The method of claim 19, wherein said plurality of thin dipoles do not overlap on said substrate.

35. The method of claim 19, wherein said plurality of thin dipoles partially overlap on said substrate.

36. A system for authenticating an object, comprising:
 (A) an RF source for illuminating said object with an RF source signal;
 (B) an RF detector for receiving a composite RF response signal from said object in response to said RF source signal; and
 (C) a processor, coupled to said detector, for determining whether said composite RF response signal is representative of an authentic response signal;
 wherein a plurality of thin dipoles are disposed in a fixed arrangement on said object, each of said thin dipoles being formed of an elongated metal article having a fixed spatial position on said object, wherein said fixed arrangement of thin dipoles generates said composite RF response signal when said plurality of thin dipoles are illuminated with said RF source signal.

37. The system of claim 36, wherein said plurality of thin dipoles are randomly disposed in said fixed arrangement.

38. The system of claim 37, wherein each of said thin dipoles has a random angular orientation.

39. The system of claim 36, wherein said fixed arrangement corresponds to an ordered arrangement of said plurality of thin dipoles.

40. The system of claim 39, wherein each of said thin dipoles has an ordered angular orientation.

41. The system of claim 36, wherein said thin dipoles are formed of metalized fibers.

42. The system of claim 36, wherein said thin dipoles are formed of aluminum.

43. The system of claim 36, wherein each of said thin dipoles is resonant at an interrogating frequency having a ½ wavelength equal to a length of said thin dipoles.

44. The system of claim 36, wherein said plurality of thin dipoles are positioned on a substrate on said object.

45. The system of claim 44, wherein said substrate is non-conductive.

46. The system of claim 45, wherein said substrate is selected from the group consisting of paper or plastic.

47. The system of claim 46, wherein said thin dipoles are disposed between inner and outer layers of plastic.

48. The system of claim 47, wherein said inner and outer layers of plastic represent first and second layers of an identification card.

49. The system of claim 48, wherein said identification card is a credit card.

50. The system of claim 44, wherein said substrate has a surface area and said plurality of thin dipoles are disposed throughout all of said surface area.

51. The system of claim 44, wherein said substrate has a surface area and said plurality of thin dipoles occupy only a portion of said surface area.

52. The system of claim 44, wherein said plurality of thin dipoles do not overlap on said substrate.

53. The system of claim 44, wherein said plurality of thin dipoles partially-overlap on said substrate.

54. A method for authenticating an object, comprising the steps of:
 (A) illuminating said object with an RF source signal from an RF source;
 (B) receiving, with an RF detector, a composite RF response signal from said object in response to said RF source signal; and
 (C) determining whether said composite RF response signal is representative of an authentic response signal;
 wherein a plurality of thin dipoles are disposed in a fixed arrangement on said object, each of said thin dipoles being formed of an elongated metal article having a fixed spatial position on said object, wherein said fixed arrangement of thin dipoles generates said composite RF response signal when said plurality of thin dipoles are illuminated with said RF source signal.

55. The method of claim 54, further comprising the step of moving said object through a reading slot while illuminating said object with said RF source signal.

56. The method of claim 55, wherein said composite RF response signal represents an amplitude of an RF signal generated by said thin dipoles as said object is moved through said reading slot.

57. The method of claim 54, wherein said plurality of thin dipoles are randomly disposed in said fixed arrangement.

58. The method of claim 57, wherein each of said thin dipoles has a random angular orientation.

59. The method of claim 54, wherein said fixed arrangement corresponds to an ordered arrangement of said plurality of thin dipoles.

60. The method of claim 59, wherein each of said thin dipoles has an ordered angular orientation.

61. The method of claim 54, wherein each of said thin dipoles is resonant at an interrogating frequency having a ½ wavelength equal to a length of said thin dipoles.

62. The method of claim 54, wherein said plurality of thin dipoles are positioned on a substrate on said object.

63. The method of claim 62, wherein said substrate is non-conductive.

64. The method of claim 63, wherein said substrate is selected from the group consisting of paper or plastic.

65. The method of claim 64, wherein said thin dipoles are disposed between inner and outer layers of plastic.

66. The method of claim 65, wherein said inner and outer layers of plastic represent first and second layers of an identification card.

67. The method of claim 66, wherein said identification card is a credit card.

68. The method of claim 62, wherein said substrate has a surface area and said plurality of thin dipoles are disposed throughout all of said surface area.

69. The method of claim 62, wherein said substrate has a surface area and said plurality of thin dipoles occupy only a portion of said surface area.

70. The method of claim 62, wherein said plurality of thin dipoles do not overlap on said substrate.

71. The method of claim 62, wherein said plurality of thin dipoles partially-overlap on said substrate.

* * * * *